(12) United States Patent
Morita et al.

(10) Patent No.: US 7,138,802 B2
(45) Date of Patent: Nov. 21, 2006

(54) NUCLEAR MAGNETIC RESONANCE APPARATUS PROBE

(75) Inventors: Hiroshi Morita, Hitachi (JP); Michiya Okada, Mito (JP); Shigeru Kakugawa, Hitachi (JP); Katsuzou Aihara, Hitachiohta (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/407,324

(22) Filed: Apr. 20, 2006

(65) Prior Publication Data

US 2006/0186885 A1    Aug. 24, 2006

Related U.S. Application Data

(63) Continuation of application No. 10/981,501, filed on Nov. 5, 2004, now Pat. No. 7,084,634, which is a continuation of application No. 10/291,690, filed on Nov. 12, 2002, now Pat. No. 6,828,791.

(30) Foreign Application Priority Data

Feb. 28, 2002    (JP) .............................. 2002-052567

(51) Int. Cl.
   *G01V 3/00*    (2006.01)
(52) U.S. Cl. ...................... 324/318; 324/322
(58) Field of Classification Search ................ 324/318, 324/321, 322
   See application file for complete search history.

(56) References Cited

U.S. PATENT DOCUMENTS

| 3,388,322 | A | | 6/1968 | Anderson et al. |
|---|---|---|---|---|
| 3,771,055 | A | | 11/1973 | Anderson |
| 4,201,941 | A | | 5/1980 | Fyfe et al. |
| 4,517,516 | A | | 5/1985 | Hill et al. |
| 4,665,368 | A | | 5/1987 | Sugiyama et al. |
| 4,748,412 | A | | 5/1988 | Yamamoto et al. |
| 5,180,982 | A | | 1/1993 | Zeiger |
| 5,258,710 | A | | 11/1993 | Black et al. |
| 5,262,727 | A | * | 11/1993 | Behbin et al. .............. 324/318 |
| 5,278,504 | A | | 1/1994 | Patrick et al. |
| 5,457,386 | A | | 10/1995 | Matsunaga et al. |
| 5,592,088 | A | | 1/1997 | Matsunaga et al. |
| 5,735,795 | A | | 4/1998 | Young et al. |
| 5,929,639 | A | | 7/1999 | Doty |
| 5,939,883 | A | | 8/1999 | Green et al. |
| 6,060,882 | A | * | 5/2000 | Doty .......................... 324/318 |
| 6,107,800 | A | | 8/2000 | Claasen-Vujcic et al. |
| 6,121,776 | A | | 9/2000 | Marek |

(Continued)

FOREIGN PATENT DOCUMENTS

JP    49-030159    8/1970

(Continued)

OTHER PUBLICATIONS

J. Nagamatsu, et al., Superconductivity at 39K in magnesium diboride, Nature, vol. 410 (No. 6824), Mar. 2001, p. 63-64.

(Continued)

*Primary Examiner*—Louis M. Arana
(74) *Attorney, Agent, or Firm*—Dickstein Shapiro LLP

(57) ABSTRACT

A nuclear magnetic resonance apparatus comprises a superconducting magnet that produces a static magnetic field, a probe having a probe coil that irradiates an RF pulse magnetic field and receives a free induction decay signal (FID signal) emitted therefrom, an RF power source that supplies the probe with an RF current, an amplifier that amplifies the FID signal, a detector that detects a signal, and an analyzer that analyzes the signal detected by the detector, wherein the probe coil includes a solenoid coil and a saddle type coil.

6 Claims, 7 Drawing Sheets

U.S. PATENT DOCUMENTS

| | | |
|---|---|---|
| 6,320,384 B1 | 11/2001 | Doty et al. |
| 6,326,789 B1 | 12/2001 | Yoshida et al. |
| 6,377,836 B1 | 4/2002 | Arakawa et al. |
| 6,493,572 B1 | 12/2002 | Su et al. |
| 6,806,713 B1 | 10/2004 | Wong |
| 6,828,791 B1 | 12/2004 | Morita et al. |

FOREIGN PATENT DOCUMENTS

| | | |
|---|---|---|
| JP | 55-033017 | 3/1975 |
| JP | 2-1580 | 1/1990 |
| JP | 04-067845 | 3/1992 |
| JP | 5-261082 | 10/1993 |
| JP | 6-47020 | 2/1994 |
| JP | 07-240310 | 9/1995 |

OTHER PUBLICATIONS

H. Kumakura, Development of manufacturing method of MgB2 New superconductor wire—Highest critical current density Achieved by a Simple method, NIMS NOW, published by Independent Legal Entity Substance-Material Research Organization, vol. 1, No. 4, Jul. 2001, p. 4.

Translation of Part of NIM NOW.

* cited by examiner

US 7,138,802 B2

NUCLEAR MAGNETIC RESONANCE APPARATUS PROBE

This application is a continuation of U.S. application Ser. No. 10/981,501, filed Nov. 5, 2004, now U.S. Pat. No. 7,084,634 which is a continuation of U.S. application Ser. No. 10/291,690, filed Nov. 12, 2002, now U.S. Pat. No. 6,828,791 the subject matter of which is incorporated in its entirety by reference.

BACKGROUND OF THE INVENTION

The present invention relates to a nuclear magnetic resonance apparatus probe and a nuclear magnetic resonance apparatus using the same.

Analysis methods for organic substances employing nuclear magnetic resonance have been making a rapid progress these days. In particular, when the methods are combined with a powerful superconducting magnet technology, it has become possible to make an efficient structural analysis on an atomic level of organic compounds, such as protein having a complicated molecular structure. The present invention is concerned with a nuclear magnetic resonance apparatus used for analyzing the structure and interaction on an atomic level of protein molecules in an aqueous solution, in which a trace amount of protein is dissolved. Namely, the invention is concerned with an energy spectrometer, of which a more outstanding performance is required than medical MRI computerized tomography scanners that are intended for computerized tomography scanning of human bodies and that must therefor offer image resolution on the order of millimeters. More specifically, the performance required includes an order of magnitude greater in terms of magnetic field strength, four orders of magnitude greater in terms of magnetic field homogeneity, and three orders of magnitude greater in terms of stability. More particularly, it is concerned with a probe coil used therein.

The nuclear magnetic resonance apparatus may be generally classified into a CW type, in which a sample is irradiated with electromagnetic waves of a constant frequency and a pulse Fourier type, in which the sample is irradiated with pulsating electromagnetic waves. Lately, however, the nuclear magnetic resonance apparatus refers in many cases to the pulse Fourier type and, in the present invention, too, the pulse Fourier type nuclear magnetic resonance apparatus is simply referred to as the nuclear magnetic resonance apparatus unless otherwise specified.

Basic configurations of the nuclear magnetic resonance apparatus are described in the book entitled "On NMR" (authored by Yoji Arata and published by Maruzen in 2000). According to the book, a nuclear magnetic resonance apparatus may be composed of a superconducting magnet that produces a static magnetic field, a probe that is capable of exposing the sample to an RF pulse magnetic field so as to produce a precession movement in a magnetization vector of an atomic nucleus and of receiving a free induction decay signal (FID signal) emitted from the sample, an RF power source that supplies the probe with an RF current, an amplifier that amplifies the FID signal, a detector that detects a signal, an analyzer that analyzes the signal detected by the detector, and the like. The probe is generally provided with a probe coil that is generally provided with functions of exposing the sample to the RP pulse magnetic field and receiving the FID signal emitted by the sample.

There are known, as recent inventions relating to typical configurations of the nuclear magnetic resonance apparatus as it is used for the analysis of protein, Japanese Patent Laid-open No. 2000-147082 and the like that disclose a typical configuration employing a multilayer air-core solenoid coil as an invention relating to the superconducting magnet, U.S. Pat. No. 6,121,776 that discloses a bird-cage type probe coil as an invention relating to signal detection technology, and Japanese Patent Laid-open No. 2000-266830, Japanese Patent Laid-open No. Hei 6-237912, and the like that disclose signal detection technology by means of a conventional saddle type probe coil or a bird-cage type probe coil. According to these inventions, there are provided in all of these conventional, high-sensitivity nuclear magnetic resonance apparatuses for use in protein analysis a superconducting magnet apparatus that produces a magnetic field in a perpendicular direction and a saddle type or bird-cage type probe coil that is capable of exposing the sample to an RP pulse magnetic field and receiving an FID signal emitted from the sample. In addition, as exemplified in U.S. Pat. No. 6,121,776, there is known a case, in which a probe coil that is cooled down to low temperatures so as to reduce thermal noise during signal reception is employed to improve the signal-to-noise ratio, or S/N ratio. As regards effects of improved sensitivity produced by the probe coil shape, it has conventionally been known that the use of a solenoid coil as the probe coil is more advantageous in many respects than using the saddle type or bird-cage type, as described in the book entitled "On NMR". The use of the solenoid coil is advantageous in terms, for example, of ease of impedance control, filling factor, and efficiency in the RF magnetic field. Since it is necessary, with the superconducting magnet that produces the magnetic field in the perpendicular direction, to irradiate the sample with the RF pulse magnetic field in the horizontal direction, however, it is impracticable to wind the solenoid coil around a sample tube in the perpendicular direction containing therein an aqueous solution of protein, and thus it is not commonly used. Particularly exceptionally, however, there has been known a case, in which the solenoid coil is used only for measurement with a good sensitivity using a trace amount of sample solution and there has been known a measurement method that takes measurement using a specially designed microsample tube and a special probe. Nonetheless, it is generally required that the static magnetic field be horizontal in order to employ a solenoid coil as the nuclear magnetic resonance apparatus probe for major use in protein analysis.

In order to employ a solenoid coil as the probe coil, there is a problem that it is difficult to install a plurality of coils to permit simultaneous measurement of different nuclides, or what is called multiple resonance. This will be elaborated upon in the following.

The probe coil is designed to resonate at a frequency of an RF pulse magnetic field. Assuming that the probe coil has a circuit configuration, in which a resistance component (resistor R), an electromagnetic induction component (inductance L), and an electrostatic capacity component (capacitance C) are connected in series with each other, a resonance frequency fo is given by equation 1.

$$f_0 = \frac{1}{2\pi\sqrt{LC}} \qquad \text{Equation 1}$$

A Q-value Q that is a factor representing intensity of resonance is given by equation 2.

$$Q = \sqrt{\frac{L}{C}\frac{1}{R}} \quad \text{Equation 2}$$

As is known from equation 1 and equation 2, it is possible to define the resonance frequency fo and the Q-value by the combination of inductance L and capacitance L; however, a different nuclide results in a different resonating frequency and it is difficult to implement multiple resonance using a simple circuit. Commonly employed methods include one in which the Q-value is kept low and a circuit is organized to respond to a plurality of resonance frequencies, one in which only one coil is installed, but the resonance frequency is switched by changing the capacitance C, and one in which a plurality of independent circuits are provided, each providing a specific required resonance frequency. According to the first method, the low Q-value results in a radiation loss of the RF pulse and, in addition, the FID signal is small, which makes it difficult to improve the S/N ratio. In the second method, it is difficult to implement quick switching. In the third method, interference caused by electromagnetic induction among different coils presents a problem. According to the conventional nuclear magnetic resonance apparatuses, therefore, the saddle type coil is disposed so that the RF pulse magnetic fields produced are orthogonal to each other. FIG. 1 is a view showing a layout of saddle type coils in a conventional nuclear magnetic resonance apparatus. FIG. 2 is a view showing a layout the saddle type coils shown in FIG. 1 seen from the above. A saddle type coil 110a and a saddle type coil 101b are disposed so as to be opposed to each other in a manner to surround a sample tube 100 and connected in series with each other electrically. A saddle type coil 102a and a saddle type coil 102b are also disposed so as to be opposed to each other and connected in series with each other electrically. A pair of saddle type coils 101, 102 are disposed so as to be orthogonal to each other. A static magnetic field direction 1 runs parallel with an axial direction of the sample tube 100. A capacitor is connected to a position near each of the saddle type coils and adjusted so as to deliver a desired resonance frequency. In the conventional nuclear magnetic resonance apparatus, in which the static magnetic field runs in the perpendicular direction, two pairs of saddle type coils are disposed so as to be orthogonal to each other, thereby making interference caused by electromagnetic induction between coils small, thus realizing multiple resonance.

In a nuclear magnetic resonance apparatus having a static magnetic field in a horizontal direction and employing a solenoid coil as the probe coil, however, it is geometrically impossible to dispose a plurality of solenoid coils so as to be orthogonal to each other around the sample tube, thus being unable to realize multiple resonance.

SUMMARY OF THE INVENTION

The problem involved with providing solenoid coils having an outstanding performance as the nuclear magnetic resonance apparatus probe can be solved by the following means. According to a first aspect of the present invention, there is provided a nuclear magnetic resonance apparatus probe comprising: a solenoid coil that is located in a homogeneous magnetic field area at substantially a center of a static magnetic field generating apparatus of the nuclear magnetic resonance apparatus, said solenoid coil being capable of, when energized, generating an RF magnetic field in a direction perpendicular to the direction of the static magnetic field generated by the static magnetic field generating apparatus; and one or more saddle type coils that are capable of, when energized, generating magnetic fields in directions perpendicular to the direction of the static magnetic field generated by the static magnetic field generating apparatus and to the direction of the RF magnetic field generated by the solenoid coil. According to this arrangement, it is possible to realize multiple resonance.

In an embodiment, there is preferably provided a nuclear magnetic resonance apparatus probe, wherein resonance frequencies of the saddle type coils and the solenoid coil can be adjusted by a capacitor, a coil, and a resistor that are electrically connected to each other, or a combination thereof, and it is possible to adjust so that the resonance frequency of the saddle type coils coincides with that of the solenoid coil. According to the arrangement, it is possible through adjustments to bring the resonance frequency of the saddle type coils into coincidence with the resonance frequency of the solenoid coil and use the saddle type coils offering a poor sensitivity for an exclusive use for irradiation of an RF pulse magnetic field and the solenoid coil offering a good sensitivity for an exclusive use for reception of the FID signal. This makes it possible, in the solenoid coil, to expedite decay in an induced current caused by an application of the RF pulse magnetic field, thus allowing the FID signal to be received immediately after the RF pulse magnetic field has been applied.

In an embodiment, there is preferably provided a nuclear magnetic resonance apparatus probe, wherein a superconductor is used for part or all of the coils used in the probe. According to this arrangement, it is possible to not only realize multiple resonance, but also achieve a nuclear magnetic resonance apparatus offering a high sensitivity, since the arrangement of using the superconductor for part or all of the coils of the probe results in a resistance of the probe coil becoming substantially zero and the Q-value increasing.

In an embodiment, there is preferably provided a nuclear magnetic resonance apparatus probe, wherein a cooling device is provided that is capable of cooling part or all of the coils used in the probe to 0 degrees Celsius or below. According to this arrangement, it is possible to not only realize multiple resonance, but also achieve a nuclear magnetic resonance apparatus offering a high sensitivity, since the arrangement of providing the cooling device that is capable of cooling part or all of the coils used in the probe to 0 degrees Celsius or below results in the resistance of the probe coil becoming small and the Q-value increasing.

In an embodiment, there is preferably provided a nuclear magnetic resonance apparatus probe, wherein the saddle type coil or the solenoid coil is provided with both the function that can irradiate a sample with an RF magnetic field that produces nuclear magnetic resonance and the function that can receive a free induction decay signal emitted from the sample. According to this arrangement, it is possible to not only realize multiple resonance, but also, by providing the coil with the functions of both irradiating the RF magnetic field and receiving the FID signal, reduce the number of coils to half that when the two functions are not both provided with the coil.

In an embodiment, there is preferably provided a nuclear magnetic resonance apparatus probe, wherein the saddle type coil is provided with the function that can irradiate a sample with an RF magnetic field that produces nuclear magnetic resonance and the solenoid coil is provided with the function that can receive a free induction decay signal emitted from the sample. According to this arrangement, it is possible to not only realize multiple resonance, but also, through the arrangement in which the saddle type coils offering a poor sensitivity are employed for the exclusive use for irradiation of the RF pulse magnetic field and the solenoid coil offering a good sensitivity is employed for the exclusive use for reception of the FID signal, to expedite, in the solenoid coil, decay in an induced current caused by the application of the RF pulse magnetic field, thus allowing the FID signal to be received immediately after the RF pulse magnetic field has been applied.

In an embodiment, there is preferably provided a nuclear magnetic resonance apparatus probe, wherein Nb, Pb, NbTi, $Nb_3Sn$, $MgB_2$, Bi-2212, Bi-2223, or Y-123 are used as the superconductor. The use of such superconducting materials makes the probe operate stably.

According to a second aspect of the present invention, there is provided a nuclear magnetic resonance apparatus comprising: a superconducting magnet that produces a static magnetic field; a probe having a probe coil that irradiates an RF pulse magnetic field and receives a free induction decay signal (FID signal) emitted therefrom; an RF power source that supplies the probe with an RF current; an amplifier that amplifies the FID signal, a detector that detects a signal; and an analyzer that analyzes the signal detected by the detector; wherein the probe coil includes a solenoid coil and a saddle type coil. According to this arrangement, it is possible to realize multiple resonance.

Preferably the saddle type coil irradiates the RF pulse magnetic field and the solenoid coil receives the FID signal. This makes it possible to receive the FID signal immediately after the RF pulse magnetic field has been applied.

BRIEF DESCRIPTION OF THE DRAWINGS

Other objects and advantages of the invention will become apparent from the following description of embodiments with reference to the accompanying drawings in which.

DESCRIPTION OF THE PREFERRED EMBODIMENTS (Embodiment 1)

Figure 1:
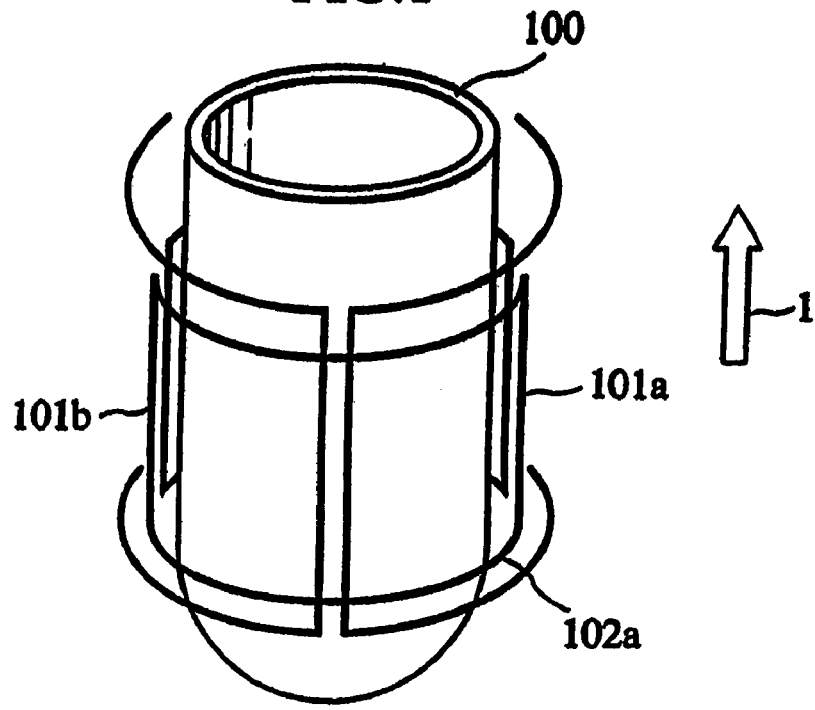
FIG. 1 is a view showing a layout of saddle type coils in a conventional nuclear magnetic resonance apparatus.
Figure 2:
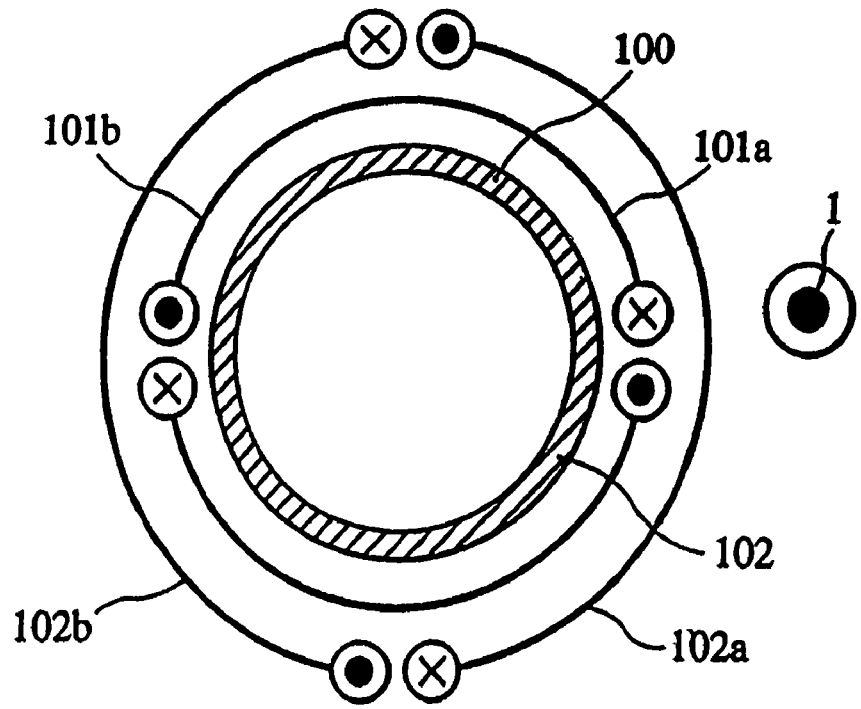
FIG. 2 is a view showing a layout of the saddle type coils shown in FIG. 1 seen from the above.
Figure 3:
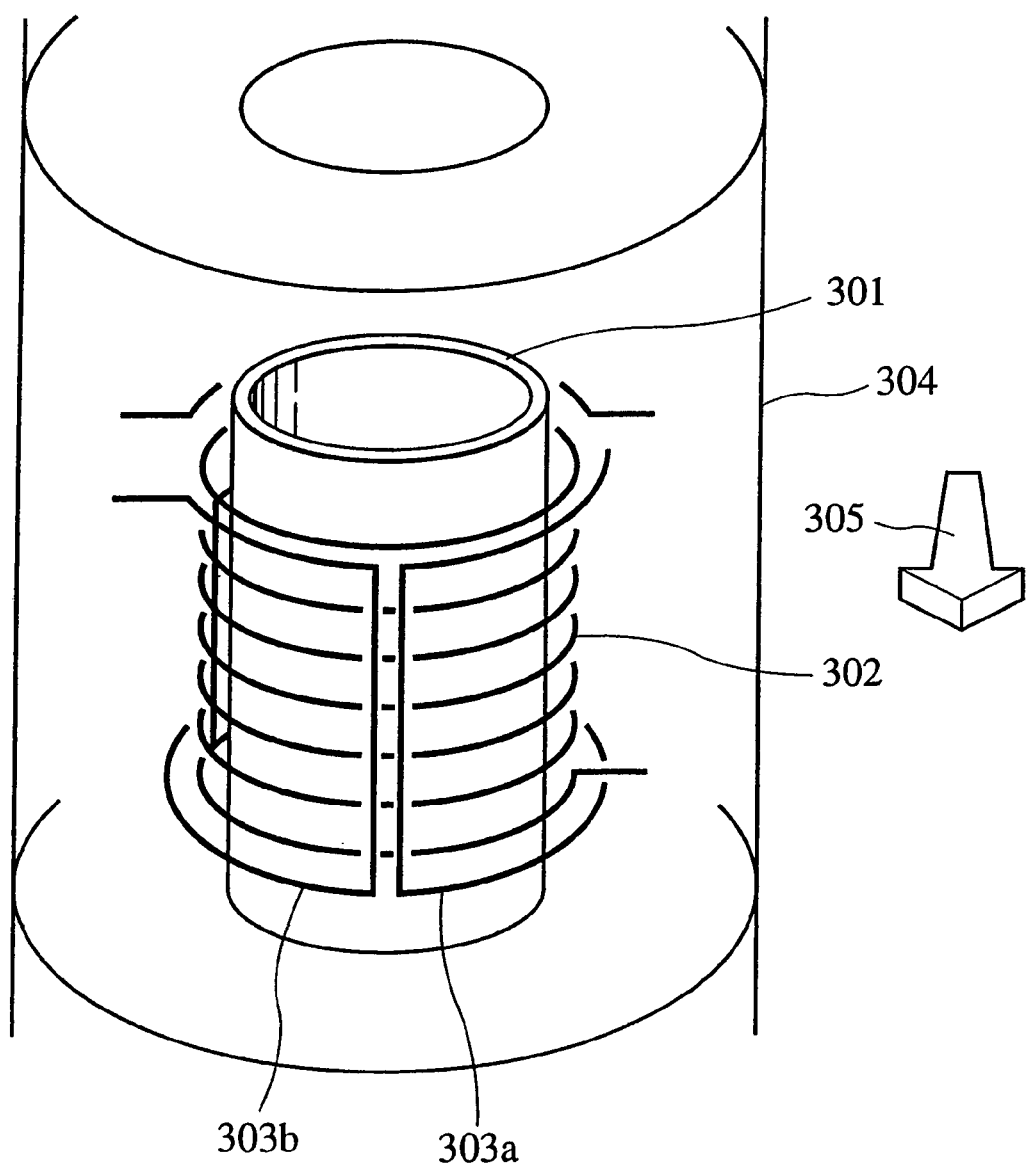
FIG. 3 is a structural view showing an area near a probe coil of a nuclear magnetic resonance apparatus probe.

FIG. 3 shows a first embodiment according to the present invention. FIG. 3 is a structural view showing an area near a probe coil of a nuclear magnetic resonance apparatus probe according to the present invention. It shows a principal point of the present invention.

A bobbin 301 is of a cylindrical shape, for which special glass having a relative permeability of a value close to 1 is used as a material thereof. The bobbin 301 has a structure that allows a sample tube containing therein a sample to be inserted therein. It is important that the bobbin 301 be made of a material that does not emit a nuclear magnetic resonance signal, since it is disposed inside a solenoid coil 302. Although no specific material is named as long as the material does not emit the nuclear magnetic resonance signal, it is desirable that glass or the like be used for reasons of ease of manufacture. In addition, since it is necessary to ensure that a homogeneous static magnetic field generated by a superconducting magnet is not disturbed, the material used for the bobbin 301 preferably has a relative permeability of a value close to 1 and is less affected magnetically. The solenoid coil 302 is wound around an outer periphery of the bobbin 301. The solenoid coil 302 is formed by winding a conductor wire. A good electric conductor, such as a copper, is used for the conductor wire. It is again desirable, as with the material for the bobbin, that a special alloy, for example an alloy with copper or aluminum having a small relative permeability used as a base material thereof (hereinafter referred to as the "special alloy"), be used so as not to disturb the homogeneous static magnetic field. Saddle type coils 303a, 303b are disposed oppositely each other around an outer periphery of the solenoid coil 302. The magnetic field generated by the superconducting magnet is perpendicular to a central axis of the solenoid coil 302 and is parallel with an intermediate plane of the saddle type coils 303a, 303b (a magnetic field direction 305 in FIG. 3). The saddle type coils 303a, 303b are connected in series with each other electrically. The saddle type coils 303a, 303b are disposed so that, when a DC current is allowed to flow therethrough, a magnetic field is generated at a center of disposition thereof in a direction perpendicular to the static magnetic field generated by the superconducting magnet and perpendicular to the central axis of the solenoid coil 302. Both of the saddle type coils 303a, 303b are made of a good electric conductor, such as copper, as with the solenoid coil 302. It is nonetheless desirable that the special alloy that does not disturb the homogeneous static magnetic field be used, as with the material for the bobbin. An RF shield 304 is disposed on an outside of the saddle type coils 303a, 303b. The RF shield 304 prevents noise from an outside of the probe from entering the solenoid coil 302 and the saddle type coils 303a, 303b. As with the solenoid coil 302 and the saddle type coils 303a, 303b, the RF shield 304 is also made of a good electric conductor, such as copper. It is again nonetheless desirable that the special alloy that does not disturb the homogeneous static magnetic field be used, as with the material for the bobbin.

Dimensions of the solenoid coil 302 are determined by the resonance frequency and the Q-value defined by equations 1 and 2, and structural restrictions. For example, suppose that the diameter is 1 cm, the axial length is 2 cm, and the number of turns is ten, then the inductance may be calculated as about 0.40 µH. If the resonance frequency is 100 MHz, then a capacitor of 6.31 pF may be connected in series with the coil. When the above-mentioned coil was actually manufactured and the resonance frequency was measured, the resonance frequency was found to fall within an error range of several percent with reference to the originally planned value. Although the saddle type coil was likewise manufactured so as to resonate at 100 MHz, it was found that the resonance frequency fell about 10% off the planned value.

As found through these experiments, it is known that the solenoid coil is superior in terms of manufacturability and ease of impedance control.

As discussed heretofore, the combination of the solenoid coil having a good sensitivity and the saddle type coil according to the present invention makes possible multiple resonance.

(Embodiment 2)

Figure 8:
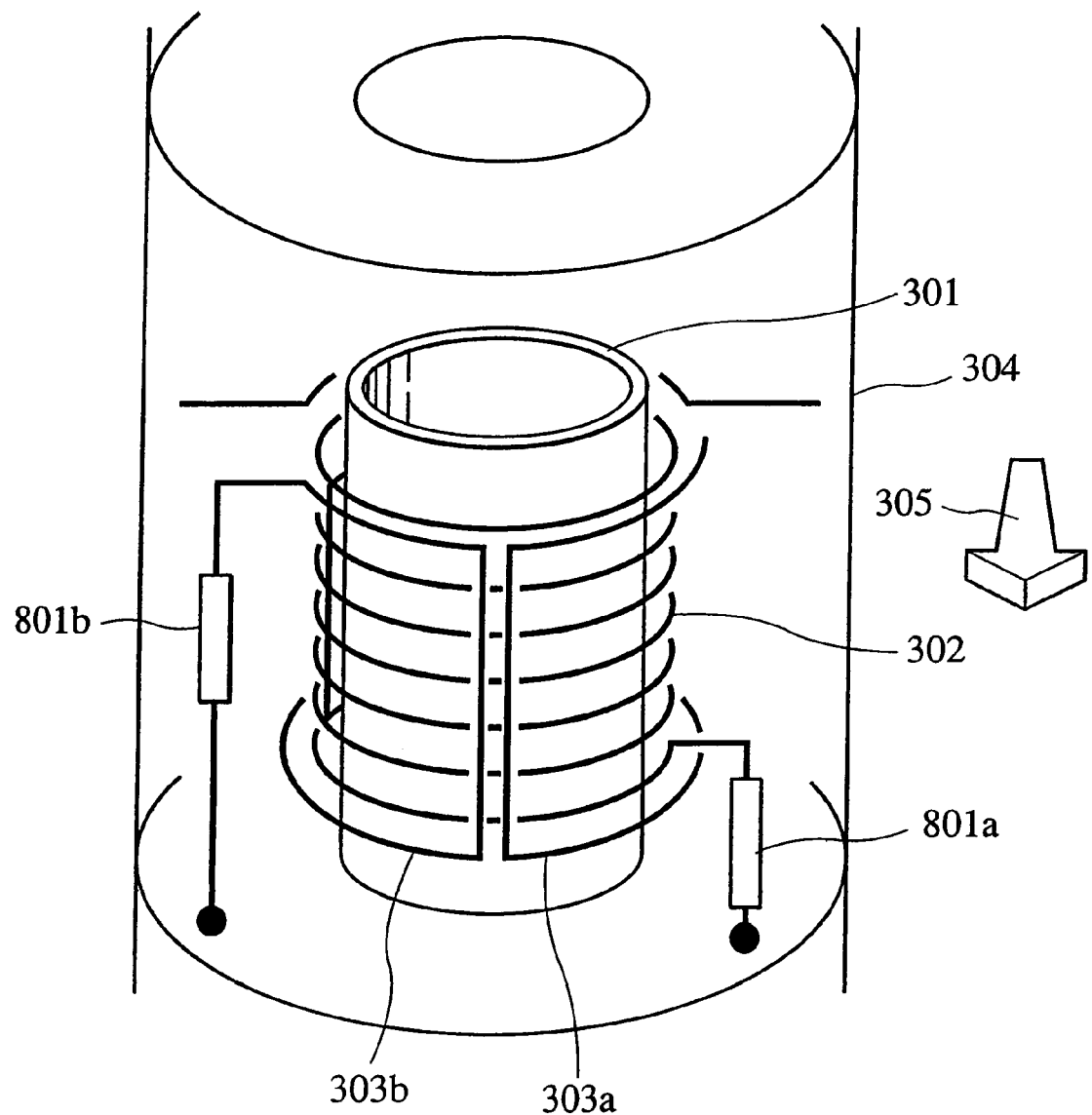
FIG. 8 is a structural view showing an area near a probe coil of a nuclear magnetic resonance apparatus probe.

FIG. 8 shows a second embodiment according to the present invention. FIG. 8 is a structural view showing an area near a probe coil of a nuclear magnetic resonance apparatus probe according to the present invention. It shows a principal point of the present invention.

Embodiment 2 has substantially the same construction as that of embodiment 1, except that, since capacitance-variable capacitors 801a, 801b are built into the solenoid coil 302 and the saddle type coils 303a, 303b of the probe, the resonance frequency can be adjusted by adjusting these capacitors. It is possible to vary the resonance frequency by not only adjusting the capacitance component, but also adjusting an inductance component. Moreover, it is possible to vary the Q-value by adjusting a resistance component. The resonance frequency can therefore be varied by inserting element parts having the capacitance component, inductance component, and resistance component, respectively, in any desired circuit points and adjusting these components. For example, multiple resonance of $^1H$ and $^2H$ can be realized by adjusting the capacitance component to vary the resonance frequency of the solenoid coil 302. It is further possible to implement multiple resonance of four or more nuclides, since the resonance frequencies of the saddle type coils 303a, 303b can likewise be varied.

(Embodiment 3)

A third embodiment according to the present invention will be explained in the following. The construction of an area near a probe coil of a nuclear magnetic resonance probe according to embodiment 3 is exactly the same as that of embodiment 1 shown in FIG. 3. A block diagram showing the probe built into a nuclear magnetic resonance apparatus is shown in a block diagram (FIG. 4) for embodiment 1. It goes without saying that a block diagram (FIG. 5) for embodiment 2 may still be perfectly all right for serving the purpose. Embodiment 3 is characterized in that a superconductor is used in part or all of the solenoid coil 302 and the saddle type coils 303a, 303b.

There are two specific benefits involved in using a superconductor for a coil conductor. First, it improves the Q-value. As shown in equation 2 noted earlier, the Q-value is inversely proportional to an electrical resistance R in a circuit. The Q-value can therefore be improved by using a superconductor having zero electrical resistance for the coil conductor. Second, it reduces thermal noise. The voltage involved with the thermal noise is proportional to electrical resistance to the one-half power. The thermal noise can therefore be made smaller by using a superconductor for the coil, which results in the improved S/N ratio. No specific substance is named for the superconductor, as long as it has the characteristics inherent therein. Examples of superconductors that may be used include Nb, Pb, and the like as metal-based superconductors, NbTi and the like as alloy-based superconductors, $Nb_3Sn$, $V_3Ga$, $MgB_2$, and the like as compound-based superconductors, and Bi-2212, Bi-2223, Y-123, and the like as oxide-based superconductors. When an RF current is flown through the circuit for energization, however, instability caused by AC loss presents a problem. It is therefore desirable that $MgB_2$ having a high critical temperature or a compound-based superconductor be used.

All of the coils may not be necessarily made of superconductors. In an arrangement, in which a single coil is used to irradiate the RF pulse magnetic field and receive the FID signal, it is impossible to observe data in the beginnings of the FID signal, since it takes time for an RF pulse current to decay. In particular if all of the coils are made of superconductors, it takes time for the RF pulse current to decay. It is therefore useful to insert an electrical resistance component locally in the coil. This is not, however, true with an arrangement, in which different coils are used to irradiate the RF pulse magnetic field and to receive the FID signal.

When the Bi-2223 superconductor was used for the solenoid coil 302 and the saddle type coils 303a, 303b in the configuration of embodiment 3, the S/N ratio was improved by about 20 times and the Q-value by about three times as good as those of the conventional probe using copper.

(Embodiment 4)

Figure 6:
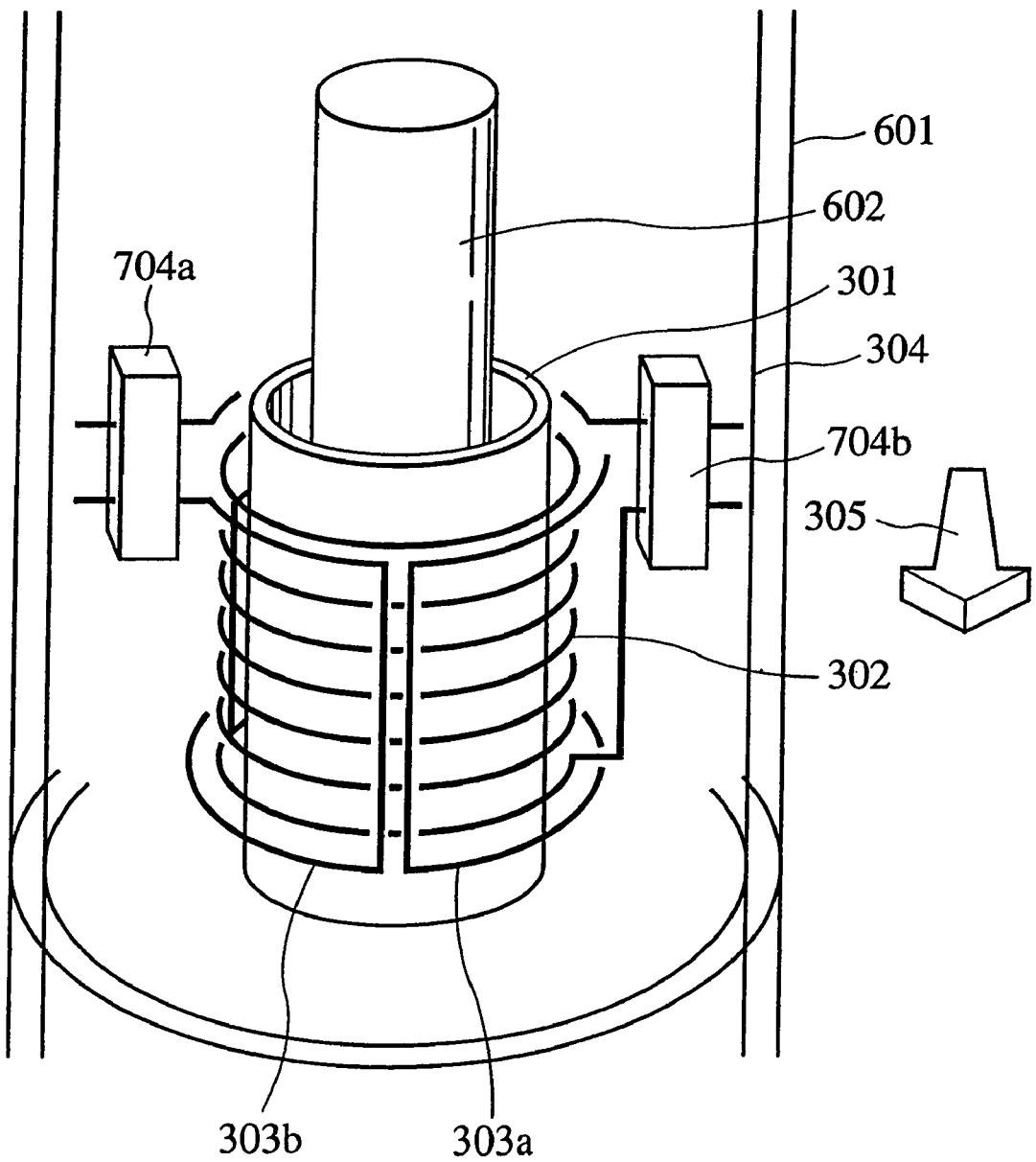
FIG. 6 is a structural view showing an area near a probe coil of a nuclear magnetic resonance apparatus probe.

FIG. 6 shows a fourth embodiment according to the present invention. FIG. 6 is a structural view showing an area near a probe coil of a nuclear magnetic resonance apparatus probe according to embodiment 4 of the present invention. It shows a principal point of the present invention.

Embodiment 4 has substantially the same construction as that of embodiment 1 shown in FIG. 3, except that a heat insulating layer 601 is disposed on an outside of the RF shield 304 while a heat insulating layer 602 is disposed on an inside of the bobbin 301. Since the heat insulating layers 601, 602 keep the inside of the probe cool at low temperatures, they are therefore disposed with the aim of reducing an amount of heat entering from the outside of the probe into the inside thereof. The heat insulating layer 601 may be made of either metal or glass, but the heat insulating layer 602 is made of special glass so as not to cut off the nuclear magnetic resonance signal because of a sample tube containing therein a sample at room temperature inserted therein. In both of these heat insulating layers, a vacuum space is provided between two sheets of metal or glass, thereby reducing entry of heat.

Embodiment 4 is further characterized in that it is provided with a structure that allows part or all of the solenoid coil 302, and the saddle type coils 303a, 303b to be cooled.

Cooling the coils offers two benefits. First, it improves the Q-value. As shown in equation 2 noted earlier, the Q-value is inversely proportional to an electrical resistance R in a circuit. Typical metals exhibit a reducing electrical resistance in an ambience of lower temperatures. With copper, for example, the electrical resistance thereof reduces to as small as 1/100 or less in an ultralow temperature of about 4K as compared with that in room temperature. Cooling the coils can therefore improve the Q-value. Second, it reduces thermal noise. The voltage involved with the thermal noise is proportional to electrical resistance to the one-half power. It is also proportional to temperature to the one-half power. The thermal noise can therefore be made smaller by adopting a construction that allows the coils to be cooled down, which results in the improved S/N ratio.

The bobbin 301 is of a cylindrical shape, for which special glass having a relative permeability of a value close to 1 is used as the material thereof. The bobbin 301 has a structure that allows a sample tube containing therein a sample to be inserted therein. It is important that the bobbin 301 be made of a material that does not emit a nuclear magnetic resonance signal, since it is disposed inside the solenoid coil 302. Although no specific material is named as long as the material does not emit the nuclear magnetic resonance signal, it is desirable that glass or the like be used for reasons of ease of manufacture. In addition, since it is necessary to ensure that a homogeneous static magnetic field generated by the superconducting magnet is not disturbed, the material used for the bobbin 301 preferably has a relative permeability of a value close to 1 and is less affected magnetically. The solenoid coil 302 is wound around an outer periphery of the bobbin 301. The solenoid coil 302 is formed by winding a conductor wire. A good electric conductor, such as a copper, is used for the conductor wire. It is again desirable, as with the material for the bobbin, that a special alloy be used so as not to disturb the homogeneous static magnetic field. The saddle type coils 303a, 303b are disposed oppositely each other around an outer periphery of the solenoid coil 302. The magnetic field generated by the superconducting magnet is perpendicular to the central axis of the solenoid coil 302 and is parallel with the intermediate plane of the saddle type coils 303a, 303b (a magnetic field direction 305 in FIG. 6). The saddle type coils 303a, 303b are connected in series with each other electrically. The saddle type coils 303a, 303b are disposed so that, when a DC current is allowed to flow therethrough, a magnetic field is generated at a center of disposition thereof in a direction perpendicular to the static magnetic field generated by the superconducting magnet and perpendicular to the central axis of the solenoid coil 302. Both of the saddle type coils 303a, 303b are made of a good electric conductor, such as copper, as with the solenoid coil 302. It is nonetheless desirable that the special alloy that does not disturb the homogeneous static magnetic field be used, as with the material for the bobbin. An RF shield 304 is disposed on an outside of the saddle type coils 303a, 303b. The RF shield 304 prevents noise from an outside of the probe from entering the solenoid coil 302 and the saddle type coils 303a, 303b. As with the solenoid coil 302 and the saddle type coils 303a, 303b, the RF shield 304 is also made of a good electric conductor, such as copper. It is again nonetheless desirable that the special alloy that does not disturb the homogeneous static magnetic field be used, as with the material for the bobbin.

Figure 7:
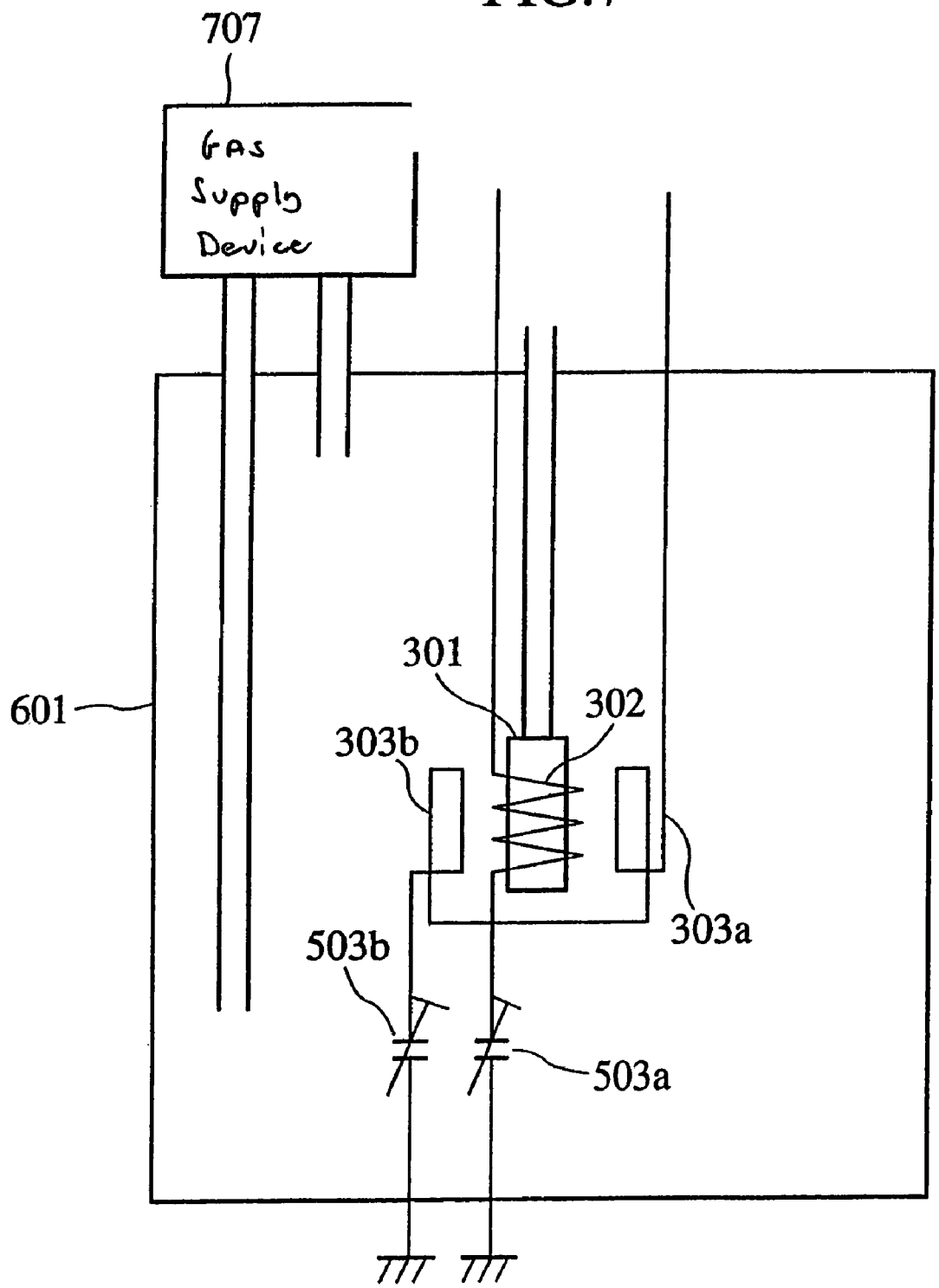
FIG. 7 is a block diagram showing a system for cooling the probe according to an embodiment.

FIG. 7 is a block diagram showing a system for cooling the probe according to the embodiment. The solenoid coil 302 is disposed outside the bobbin 301 and the saddle type coils 303a, 303b are connected in series with each other electrically. The solenoid coil and the saddle type coils are connected in series with capacitance-variable capacitors 503a, 503b, respectively. According to the embodiment, the resonance frequency is set by connecting the capacitance-variable capacitors in series. The resonance frequency can nonetheless be set according to inductance of a coil, capacitance of a capacitor, electrical resistance of a coil and conductive wire, and the like and it is still possible to insert each of these elements at a location other than those according to embodiment 4. In addition, according to embodiment 4, signal amplifiers 704a, 704b are disposed inside the probe main body, namely, inside a heat insulating layer 601. This is done to prevent, as much as possible, thermal noise from entering in the FID signal of the order of microvolts between each coil and the signal amplifiers 704a, 704b. The inside of the probe is cooled as gas, chilled by a low-temperature gas supply device 707, circulates therethrough. Helium, nitrogen, or other gas that is inert and has a low boiling point is desirable for ease of handling thereof as the low-temperature gas. Helium is used as the low-temperature gas according to embodiment 4. The low-temperature gas supply device 707 may be composed of a compressor, a GM refrigerator, and the like provided therein, capable of supplying helium gas at 10K continuously at a rate of about 500 cc/min. The helium gas, after having circulated through the inside of the probe, is drawn in by the low-temperature gas supply device 707. When a case, in which helium gas was supplied in the configuration described heretofore, was compared with that, in which helium gas was not supplied, namely, the inside of the probe was kept at room temperature, it was found that there was an increase in the case, in which helium gas was supplied, by about ten times in the S/N ratio and by about two times in Q-value over the case, in which no helium gas was supplied.

Although the low-temperature gas supply device 707 is used to cool the inside of the probe according to embodiment 4, it is not the only type to be used as the cooling device. For example, a GM refrigerator may be directly built into the probe and the inside of the probe is cooled through conduction only without using helium gas. It is also possible to directly introduce liquid helium or the like, instead of gas. In this case, the liquid helium may be introduced into the inside of the probe through a transfer tube from an external liquid sump.

The signal amplifiers 704a, 704b provide only a low amplification factor when cooled down to an ultralow temperature. According to embodiment 4, therefore, a heater is built into the signal amplifiers 704a, 704b, thereby controlling the temperature of the amplifiers at about 80K. An arrangement is also possible, in which another low-temperature gas supply device is provided and a cooling circuit is provided that can provide gas at about 80K for the exclusive use for cooling the signal amplifiers. A configuration is still possible that allows the amount of heat entering the inside of the probe to be controlled through radiation and conduction, thereby letting the temperature of the signal amplifiers 704a, 704b stabilize at about 80K.

(Embodiment 5)

Figure 4:
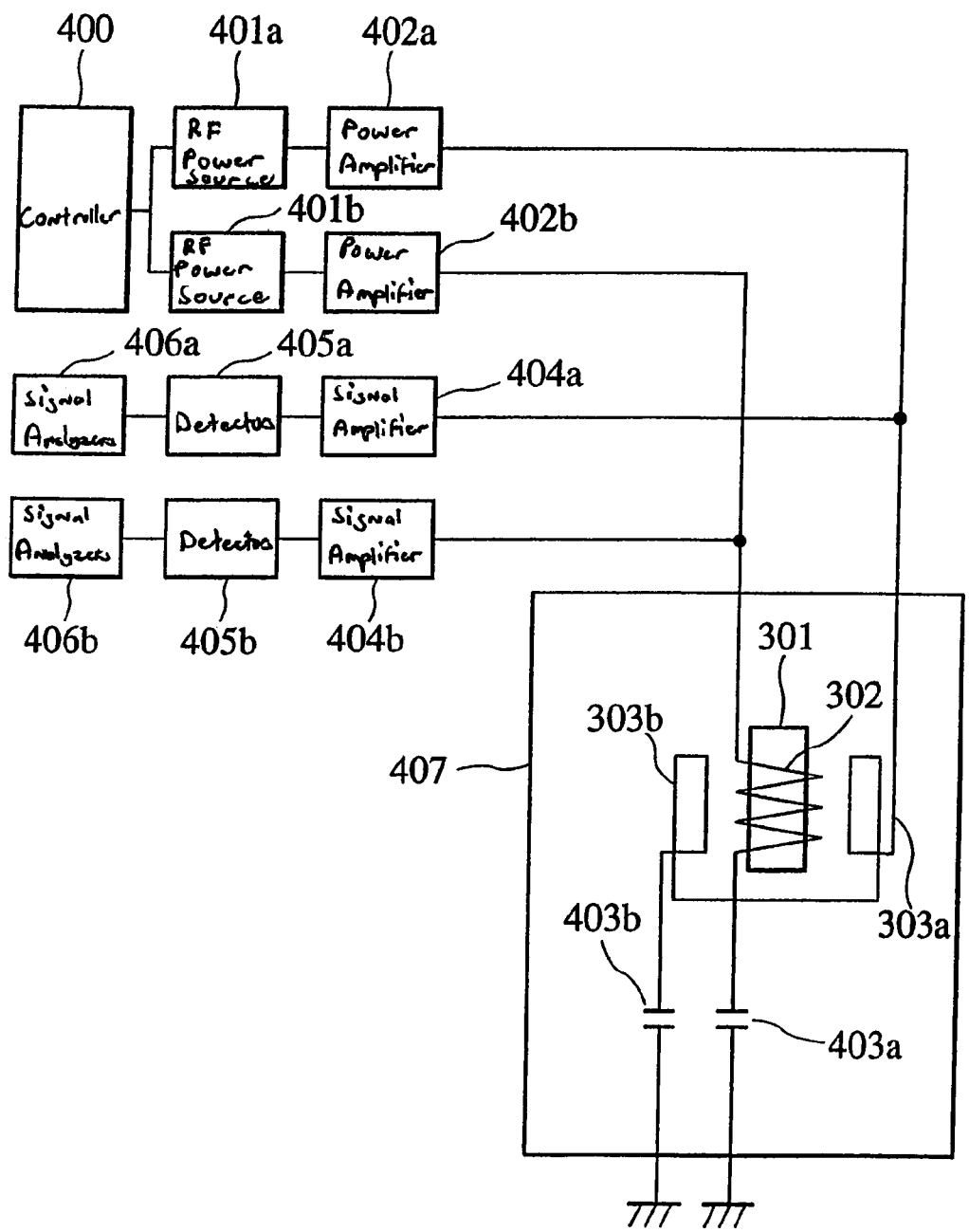
FIG. 4 is a block diagram showing the nuclear magnetic resonance probe according to an embodiment of the present invention built into a nuclear magnetic resonance apparatus.

FIG. 4 is a block diagram showing the nuclear magnetic resonance apparatus according to the embodiment. A probe 407 is provided therein with the solenoid coil 302, the saddle type coils 303a, 303b, the bobbin 301, and capacitors 403a, 403b. Although not indicated in FIG. 4, the probe 407 is disposed in a homogeneous static magnetic field generated by a superconducting magnet.

The capacitors 403a, 403b have any given levels of capacitance to ensure that each of the coils is able to produce an RF magnetic field using the resonance frequency and the Q-value given by equation 1 and equation 2. RF power sources 401a, 401b are generated in each of the coils and an RF pulse current amplified up to several hundred watts by power amplifiers 402a, 402b flows therethrough. This RF pulse current can be generated at any given frequency, pulse width, and sequence by a controller 400. For example, the frequency is set so as to resonate with $^{13}C$ at the solenoid coil 302 and with $^{1}H$ at the saddle type coils 303a, 303b, thereby exciting multiple resonances of $^{13}C$ and $^{1}H$. In such a case, it is desirable that a solenoid coil be used for the coil that observes a nuclide with a small FID signal, such as $^{13}C$. Each of the coils is connected to signal amplifiers 404a, 404b, in which the FID signals are amplified, detected by detectors 405a, 405b, and subjected to Fourier transform by signal analyzers 406a, 406b for data analysis. There may a number of different configurations possible for peripheral devices other than those cited herein. What is important is that multiple resonance be effected by providing individual circuits for the solenoid coil 302 and for the saddle type coils 303a, 303b.

According to the embodiment, one solenoid coil and a pair of saddle type coils are employed. The number of each of these coils may be even more, as long as each coil type is constructed so as to be capable of generating an RF pulse magnetic field perpendicular to the static magnetic field generated by the superconducting coil. For example, a configuration is possible, in which another solenoid coil is disposed coaxially with the solenoid coil 302 and a capacitor, an RF power source, and the like are incorporated to allow each of these solenoid coils to resonate at a frequency different from each other. The configuration may further include a saddle type coil added thereto. Such a configuration enables even a greater number of multiple resonances. In addition, each of the coils may even be of a split structure. Although one solenoid coil 302 is provided in the embodiment, there may be provided two similar solenoid coils placed apart an equal distance from a center therebetween, namely, a split coil or a Helmholtz resonator. Such a configuration makes it possible to minimize electromagnetic interference between the saddle type coils 303a, 303b and the solenoid coil 302.

(Embodiment 6)

Figure 5:
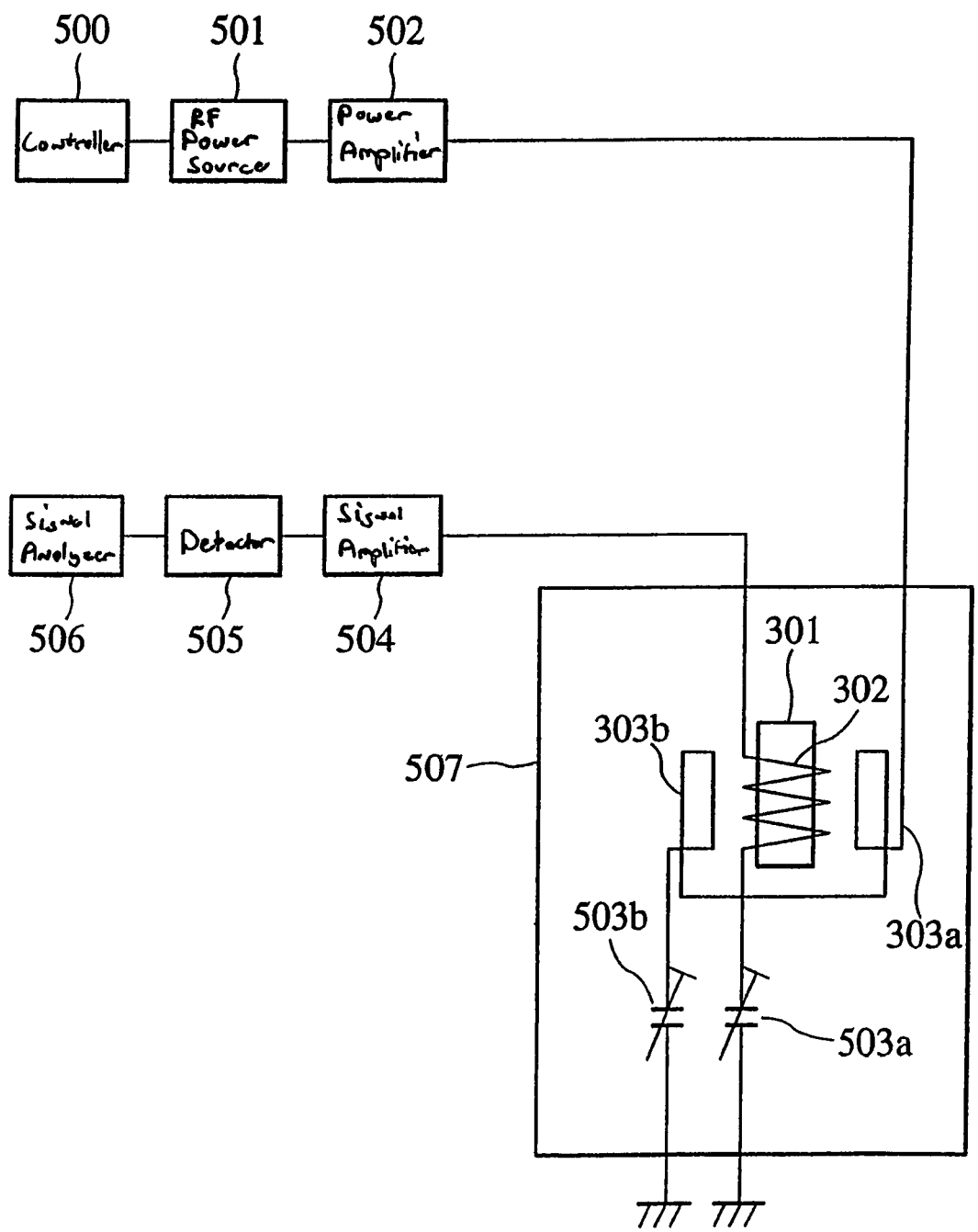
FIG. 5 is a block diagram showing the nuclear magnetic resonance probe according to an embodiment of the present invention built into a nuclear magnetic resonance apparatus.

A sixth embodiment according to the present invention will be described with reference to FIG. 5. The structural view of an area near a probe coil of the nuclear magnetic resonance probe according to embodiment 6 is the same as that for embodiment 1 shown in FIG. 3. Since the block diagram showing the nuclear magnetic resonance probe according to the embodiment built into a nuclear magnetic resonance apparatus is different, however, the block diagram showing the nuclear magnetic resonance apparatus according to the embodiment is shown in FIG. 5.

A probe 507 is provided therein with the solenoid coil 302, the saddle type coils 303a, 303b, the bobbin 301, and the capacitance-variable capacitors 503a, 503b. Although not indicated in FIG. 5, the probe 507 is disposed in a homogeneous static magnetic field generated by a superconducting magnet. The capacitance-variable capacitors 503a, 503b are capacitors that are capable of varying capacitance thereof so as to deliver the resonance frequency given by equation 1. The solenoid coil 302 and the saddle type coils 303a, 303b can be set to resonate at the same resonance frequency. An RF power source 501 is generated in the saddle type coils 303a, 303b and an RF pulse current amplified up to several hundred watts by a power amplifier 502 flows therethrough. This RF pulse current can be generated at any given frequency, pulse width, and sequence by a controller 500. The solenoid coil 302 is, on the other hand, connected to a signal amplifier 504, in which the FID signal is amplified, detected by a detector 505, and subjected to Fourier transform by a signal analyzer 506 for data analysis. Namely, according to the embodiment, the RF pulse magnetic field is irradiated by the saddle type coils 303a, 303b and the FID signal is received by the solenoid coil 302.

According to embodiment 1, a single coil is employed to irradiate the RF pulse magnetic field and to receive the FID signal. Since it takes time in this arrangement for the RF pulse current to decay, however, there is a problem yet to be solved in observing data in the beginnings of the FID signal. Especially with the solenoid coil, on one hand it has a high filling factor to enhance sensitivity, on the other hand, it has a large inductance and requires time to allow the RF pulse current to decay. It is therefore preferable that irradiation be performed by the saddle type coils 303a, 303b and reception by the solenoid coil 302 having a good sensitivity. To implement this arrangement, it is necessary that the capacitance-variable capacitors 503a, 503b be used for the capacitor that determines the resonance frequency, thereby bringing the resonance frequency of each coil into coincidence with the resonance frequency of the nuclide being observed. The resonance frequency are to be set according to inductance of a coil, capacitance of a capacitor, and electrical resistance of a coil and conductive wire and it is still possible to insert each of these elements at a location other than those according to the embodiment. Although there may a number of different configurations possible for peripheral devices other than those cited herein, an arrangement should be provided, in order to acquire data of even greater detail, so that the solenoid coil 302 is for the exclusive use for reception and the saddle type coils 303a, 303b for the exclusive use for irradiation.

Multiple resonance can be achieved by providing a horizontal static magnetic field and using a solenoid coil offering a good sensitivity as the probe coil according to the embodiments of the present invention.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A nuclear magnetic resonance apparatus probe comprising:
   a solenoid coil made of $MgB_2$ superconductor that is located in a magnetic field area at substantially a center of a static magnetic field generating apparatus of the nuclear magnetic resonance apparatus;
   saddle type coils made of $MgB_2$ superconductor that are capable of generating magnetic fields in the static magnetic field generated by the magnetic field generating apparatus, said saddle type coils being disposed opposite each other; and
   an RF shield, disposed outside said saddle type coils, for preventing noise from entering said solenoid coil and saddle type coils.

2. The nuclear magnetic resonance apparatus probe according to claim 1, wherein resonance frequencies of the saddle type coils and the solenoid coil can be adjusted so that the resonance frequency of the saddle type coils coincides with that of the solenoid coil.

3. The nuclear magnetic resonance apparatus probe according to claim 2, which further comprises a cooling device that is capable of cooling at least a portion of said solenoid coil and saddle type coils to 0 degrees Celsius or below.

4. A nuclear magnetic resonance apparatus comprising:
   a superconducting magnet that produces a static magnetic field;
   a probe having a probe coil that irradiates an RF magnetic field and receives a free induction decay signal (FID signal) emitted therefrom;
   an RF power source that supplies the probe with an RF current;
   a detector that detects a signal;

an analyzer that analyzes the signal detected by the detector; and an RF shield, disposed outside the coils, for preventing noise from entering the coils, wherein the probe coil comprises a solenoid coil made of $MgB_2$ superconductor and saddle type coils made of $MgB_2$ superconductor disposed opposite each other.

5. The nuclear magnetic resonance apparatus according to claim 4, wherein resonance frequencies for the saddle type coils and the solenoid coil can be adjusted so that the resonance frequency of the saddle type coils coincides with that of the solenoid coil.

6. The nuclear magnetic resonance apparatus according to claim 4, which further comprises a cooling device that is capable of cooling at least a portion of said solenoid coil and saddle type coils to 0 degrees Celsius or below.

* * * * *